United States Patent
Shehab et al.

(10) Patent No.: US 12,086,203 B2
(45) Date of Patent: Sep. 10, 2024

(54) NOISE REDUCED CIRCUITS FOR SUPERCONDUCTING QUANTUM COMPUTERS

(71) Applicant: IONQ, INC., College Park, MD (US)

(72) Inventors: Omar Shehab, Hyattsville, MD (US); Isaac Hyun Kim, Menlo Park, CA (US)

(73) Assignee: IONQ, INC., College Park, MD (US)

( * ) Notice: Subject to any disclaimer, the term of this patent is extended or adjusted under 35 U.S.C. 154(b) by 51 days.

(21) Appl. No.: 17/981,939

(22) Filed: Nov. 7, 2022

(65) Prior Publication Data

US 2023/0085177 A1 Mar. 16, 2023

Related U.S. Application Data

(62) Division of application No. 16/867,332, filed on May 5, 2020, now Pat. No. 11,586,702.

(60) Provisional application No. 62/852,269, filed on May 23, 2019.

(51) Int. Cl.
  *G06F 17/11* (2006.01)
  *G06N 10/00* (2022.01)
  *H10N 60/12* (2023.01)
(52) U.S. Cl.
  CPC ............ *G06F 17/11* (2013.01); *G06N 10/00* (2019.01); *H10N 60/12* (2023.02)
(58) Field of Classification Search
  None
  See application file for complete search history.

(56) References Cited

U.S. PATENT DOCUMENTS

| | | |
|---|---|---|
| 8,633,437 B2 | 1/2014 | Dantus et al. |
| 9,335,606 B2 | 5/2016 | Hanson et al. |
| 9,858,531 B1 | 1/2018 | Monroe et al. |
| 2006/0249670 A1 | 11/2006 | Monroe et al. |
| 2009/0213444 A1 | 8/2009 | Goto et al. |

(Continued)

OTHER PUBLICATIONS

Farhang Haddadfarshi et al. "High Fidelity Quantum Gates of Trapped Ions in the Presence of Motional Heating", New Journal of Physics, vol. 18, No. 12, Dec. 2, 2016, p. 123007, XP055722925.

(Continued)

*Primary Examiner* — Jay C Chang
(74) *Attorney, Agent, or Firm* — Patterson + Sheridan, LLP

(57) ABSTRACT

Embodiments described herein are generally related to a method and a system for performing a computation using a hybrid quantum-classical computing system, and, more specifically, to providing an approximate solution to an optimization problem using a hybrid quantum-classical computing system that includes a group of trapped ions. A hybrid quantum-classical computing system that is able to provide a solution to a combinatorial optimization problem may include a classical computer, a system controller, and a quantum processor. The methods and systems described herein include an efficient and noise resilient method for constructing trial states in the quantum processor in solving a problem in a hybrid quantum-classical computing system, which provides improvement over the conventional method for computation in a hybrid quantum-classical computing system.

16 Claims, 9 Drawing Sheets

(56) References Cited

U.S. PATENT DOCUMENTS

2018/0114138 A1    4/2018    Monroe et al.
2019/0095811 A1\*  3/2019    Antonio ................ G06N 10/00

OTHER PUBLICATIONS

International Search Report dated Sep. 4, 2020 for Application No. PCT/US2020/034008.
Search Report Dated Aug. 27, 2020 for Application No. PCT/US2020/034010.
G.-D. Lin et al., Large-scale quantum computation in an anharmonic linear ion trap. Europhysics Letters, 86, 60004 (2009).
Yukai Wu, Noise Analysis for High-Fidelity Quantum Entangling Gates in an Anharmonic Linear Paul Trap. Physical Review A 97, 062325 (2018).
T. Choi et al., Optimal Quantum Control of Multimode Couplings between Trapped Ion Qubits for Scalable Entanglement. Physical Review Letters 112, 190502 (2014).
A. Sørensen, K. Mølmer, Quantum computation with ions in thermal motion. Physical Review Letters 82, 1971-1974 (1999).
K. Mølmer, A. Sørensen, Multiparticle entanglement of hot trapped ions. Physical Review Letters 82, 1835-1838 (1999).
S.-L. Zhu, C. Monroe, L.-M. Duan, Arbitrary-speed quantum gates within large ion crystals through minimum control of laser beams. Europhysics Letters 73, 485-491 (2006).
K. Wright et al., Benchmarking an 11-qubit quantum computer. arXiv:1903.08181 [quant-ph] (2019).
S. Debnath, N. M. Linke, C. Figgatt, K. A. Landsman, K. Wright, C. Monroe, Demonstration of a small programmable quantum computer with atomic qubits. Nature 536, 63-66 (2016).
N. M. Linke, D. Maslov, M. Roetteler, S. Debnath, C. Figgatt, K. A. Landsman, K. Wright, C. Monroe, Experimental comparison of two quantum computing architectures. Proc. Natl. Acad. Sci. U.S.A. 114, 3305-3310 (2017).
Shi-Liang Zhu, C. Monroe, and L.-M. Duan, Trapped Ion Quantum Computation with Transverse Phonon Modes. Physical Review Letters 97, 050505 (2006).
A. W. Harrow, A. Hassidim, S. Llyod, Quantum algorithm for solving linear systems of equations. Physical Review Letters 15, 150502 (2009).
M. Benedetti, D. Garcia-Pintos, O. Perdomo, V. Leyton-Ortega, Y. Nam, A. Perdomo-Ortiz, A generative modeling approach for benchmarking and training shallow quantum circuits. arXiv:1801.07686 [quant-ph] (2018).
P. W. Shor, Polynomial-time algorithms for prime factorization and discrete logarithms on a quantum computer. SIAM Rev. 41, 303-332 (1999).
M. Reiher, N. Wiebe, K. M. Svore, D.Wecker, M. Troyer, Elucidating reaction mechanisms on quantum computers. Proc. Natl. Acad. Sci. U.S.A. 114, 7555{7560 (2017).
Y. Nam and D. Maslov, Low cost quantum circuits for classically intractable instances of the Hamiltonian dynamics simulation problem. arXiv:1805.04645 [quant-ph] (2018).
S. Lloyd, M. Mohseni, P. Rebentrost, Quantum principal component analysis. Nature Physics 10, 631 (2014).
R. Orus, S. Mugel, E. Lizaso, Quantum computing for finance: overview and prospects. arXiv:1807.03890 [quant-ph] (2019).
E. Hewitt, R. E. Hewitt, The Gibbs-Wilbraham phenomenon: An episode in Fourier analysis, Archive for History of Exact Sciences 21, 129-160 (1979).
M. A. Nielsen, I. L. Chuang, Quantum Computation and Quantum Information (Cambridge Univ. Press, New York, NY, 2000).
Y.Wu, S.-T.Wang, L.-M. Duan, Noise Analysis for High-Fidelity Quantum Entangling Gates in an Anharmonic Linear Paul Trap. Physical Review A 97, 062325 (2018).
C. Marquet, F. Schmidt-Kaler, D. F. V. James, Phononphonon interactions due to non-linear effects in a linear ion trap. Applied Physics B 76, 199-208 (2003).
D. J. Wineland, C. Monroe, W. M. Itano, D. Leibfried, B. E. King, D. M. Meekhof, Experimental Issues in Coherent Quantum-State Manipulation of Trapped Atomic Ions, J. Res. Natl. Inst. Stand. Technol. 103, 259-328 (1998).
J. P. Gaebler, T. R. Tan, Y. Lin, Y. Wan, R. Bowler, A. C. Keith, S. Glancy, K. Coakley, E. Knill, D. Leibfried, D. J. Wineland, High-Fidelity Universal Gate Set for 9Be+ ion qubits. Physical Review Letters 117, 060505 (2016).
C. J. Ballance, T. P. Harty, N. M. Linke, M. A. Sepiol, D. M. Lucas, High-Fidelity Quantum Logic Gates Using Trapped-Ion Hyperfine Qubits. Physical Review Letters 117, 060504 (2016).
T. P. Harty, D. T. C. Allcock, C. J. Ballance, L. Guidoni, H. A. Janacek, N. M. Linke, D. N. Stacey, D. M. Lucas, High-delity preparation, gates, memory, and readout of a trapped-ion quantum bit. Physical Review Letters 113, 220501 (2014).
P. H. Leung, K. A. Landsman, C. Figgatt, N. M. Linke, C. Monroe, K. R. Brown, Robust 2-qubit gates in a linear ion crystal using a frequency-modulated driving force. Physical Review Letters 120, 020501 (2018).
T. J. Green, M. J. Biercuk, Phase-modulated decoupling and error suppression in qubit-oscillator systems. Physical Review Letters 114, 120502 (2015).
Y. Nam et al., Ground-state energy estimation of the water molecule on a trapped ion quantum computer. arXiv:1902.10171 [quant-ph] (2019).
G. E. Crooks, Performance of the quantum approximate optimization algorithm on the maximum cut problem. arXiv:1811.08419 [quant-ph] (2018).
Y. Nam, Y. Su, D. Maslov, Approximate quantum Fourier transform with O(n log(n)) T gates. arXiv:1803.04933 [quant-oh] (2018).
T. G. Draper, S. A. Kutin, E. M. Rains, K. M. Svore, A logarithmic-depth quantum carry-lookahead adder. Quant. Inf. Comp. 6, 351-369 (2006).
R. Babbush et al., Encoding electronic spectra in quantum circuits with linear T complexity. Physical Review X 8, 041015 (2018).
L. K. Grover, Quantum mechanics helps in searching for a needle in a haystack. Physical Review Letters 79, 325 (1997).
S. Bravyi, J. Haah, Magic state distillation with low overhead. Physical Review A 86, 052329 (2012).
J. O'Gorman, E. T. Campbell, Quantum computation with realistic magic state factories. Physical Review A 95, 032338 (2017).
F. A. Aloul, A. Ramani, I. L. Markov, K. A. Sakallah, Solving difficult SAT instances in the presence of symmetry. Proc. Des. Automat. Conf. 731-736 (2002).
C. Figgatt, A. Ostrander, N. M. Linke, K. A. Landsman, D. Zhu, D. Maslov, C. Monroe, Parallel entangling operations on a universal ion trap quantum computer. arXiv:1810.11948 [quant-ph] (2018).
Y. Lu, S. Zhang, K. Zhang, W. Chen, Y. Shen, J. Zhang, J.-N. Zhang, K. Kim, Scalable global entangling gates on arbitrary ion qubits. arXiv:1901.03508 [quant-ph] (2019).
N. Grzesiak, R. BlÃ¼mel, K. Beck, K. Wright, V. Chaplin, J. Amini, N. Pisenti, S. Debnath, J.-S. Chen, Y. Nam, Efficient arbitrary simultaneously entangling gates on a trapped-ion quantum computer. Nature Communications 11, 2963 (2020).
J. T. Merrill, K. R. Brown, Progress in compensating pulse sequences for quantum computation. arXiv: 1203.6392 [quant-ph] (2012).
M. X. Goemans, D. P. Williamson, Improved approximation algorithms for maximum cut and satisfability problems using Semidefinite Programming. J. ACM 42, 1115-1145 (1995).
A. M. Childs, D. Maslov, Y. Nam, N. J Ross, Y. Su, Toward the first quantum simulation with quantum speedup. Proc. Natl. Acad. Sci. U.S.A. 115, 9456-9461 (2018).
V. V. Shende, I. L. Markov, S. S. Bullock, Minimal universal two-qubit controlled-NOT-based circuits. Physical Review A 69, 062321 (2004).
D. Maslov, Advantages of using relative-phase Toffoli gates with an application to multiple control Toffoli optimization. Physical Review A 93, 022311 (2016).
International Search Report dated May 29, 2020 for Application PCT/US2020/015232.
Pak Hong Leung et al., Entangling an Arbitrary Prior of Qubits in a Long Ion Crystal. arXiv: 1808.02555 [quant-ph] (2018).

(56) References Cited

OTHER PUBLICATIONS

G. M. Amdahl, Validity of the single processor approach to achieving large scale computing capabilities. AFIPS Conf. Proc. 30, 483-485 (1967).

R. P. Feynman, Simulating physics with computers. Int. J. Theor. Phys. 21, 467-488 (1982).

Y. Wang, M. Um, J. Zhang, S. An, M. Lyu, J.-N. Zhang, L.-M. Duan, D. Yum, K. Kim, Single-qubit quantum memory exceeding ten-minute coherence time. Nature Photon 11, 646-650 (2017).

A. Spörl, T. Schulte-Herbrüggen, S. J. Glaser, V. Bergholm, M. J. Storcz, J. Ferber, F. K. Wilhelm, Optimal control of coupled Josephson qubits. Physical Review A75, 012302 (2007).

D. Maslov, Y. S. Nam, J. Kim, An outlook for quantum computing, Proc. IEEE, 107, 5-10 (2019).

Y. Nam, D. Maslov, Low cost quantum circuits for classically intractable instances of the Hamiltonian dynamics simulation problem. arXiv:1805.04645 [quant-ph] (2018).

J. M. Gambetta, F. Motzoi, S. T. Merkel, F. K. Wilhelm, Analytic control methods for high-fidelity unitary operations in a weakly nonlinear oscillator. Physical Review A 83, 012308 (2011).

S. Boyd, L. Vandenberghe, Convex Optimization (Cambridge Press, New York, NY, 2004).

S. Beauregard, Circuit for Shors algorithm using 2n + 3 qubits. Quant. Inf. Comp. 3, 175-185 (2003).

D. Maslov, Y. Nam, Use of global interactions in efficient quantum circuit constructions. New J. Phys. 20, 033018 (2018).

E. Bernstein, U. Vazirani, Quantum complexity theory, SIAM J. Comput. 26, 1411-1473 (1997).

W. van Dam, S. Hallgren, L. Ip, Quantum algorithms for some hidden shift problems. SIAM J. Comput. 36, 763-778 (2006).

F. A. Calderon-Vargas, G. S. Barron, X.-H. Deng, A. J. Sigillito, E. Barnes, S. E. Economou, Fast high- fidelity entangling gates in Si double quantum dots. arXiv:1902.02350 [quant-ph] (2019).

L. S. Theis, F. Motzoi, F. K. Wilhelm, M. Saman, High-fidelity Rydberg-blockade entangling gate using shaped, analytic pulses. Physical Review A 94, 032306 (2016).

M. M. Müller, H. R. Haakh, T. Calarco, C. P. Koch, C. Henkel, Prospects for fast Rydberg gates on an atom chip. Quant. Inf. Process. 10, 771792 (2011).

International Search Report dated May 28, 2020 for Application No. PCT/US2020/015234.

International Search Report dated May 28, 2020 for Application No. PCT/US2020/015235.

Bravyi, S. B., Landau, L. D., Kitaev, A. Y. (2002). Fermionic quantum computation. Annals of Physics, 298(1), 210-226. https://doi.org/10.1006/aphy.2002.6254.

Colless, J. I., Ramasesh, V. V., Dahlen, D., Blok, M. S., Kimchi-Schwartz, M. E., McClean, J. R., Carter, J., De Jong, W. A., & Siddiqi, I. (2018). Computation of Molecular Spectra on a Quantum Processor with an Error-Resilient Algorithm. Physical Review X, 8(1), 011021. https://doi.org/10.1103/PhysRevX.8.011021.

Cormen, T. H., Leiserson, C. E., Rivest, R. L., Clifford Stein. (2009). Introduction to algorithms. MIT press. (Cormen et al., 2009).

Dobšíček, M., Johansson, G., Shumeiko, V., Wendin, G. (2007). Arbitrary accuracy iterative phase estimation algorithm as a two qubit benchmark. Physical Review A, 76(3), 030306. https://doi.org/10.1103/PhysRevA.76.030306.

Dumitrescu, E. F., McCaskey, A. J., Hagen, G., Jansen, G. R., Morris, T. D., Papenbrock, T., Pooser, R. C., Dean, D. J., Lougovski, P. (2018). Cloud Quantum Computing of an Atomic Nucleus. Physical Review Letters, 120(21), 210501. https://doi.org/10.1103/PhysRevLett.120.210501.

Evenbly, G., Vidal, G. (2007). Algorithms for entanglement renormalization. Physical Review B, 79(14), 144108. https://doi.org/10.1103/PhysRevB.79.144108.

Farhi, E., Goldstone, J., Gutmann, S. (2014). A Quantum Approximate Optimization Algorithm. ArXiv:1411.4028 [Quant-Ph]. http://arxiv.org/abs/1411.4028.

Figgatt, C. M. (2018). Building and Programming a Universal Ion Trap Quantum Computer. http://iontrap.umd.edu/wp-content/uploads/2013/10/FiggattThesis.pdf.

Hadfield, S., Papageorgiou, A. (2018). Divide and conquer approach to quantum Hamiltonian simulation. New Journal of Physics, 20(4), 043003. https://doi.org/10.1088/1367-2630/aab1ef.

Jones, N. C., Whitfield, J. D., McMahon, P. L., Yung, M. H., Meter, R. van, Aspuru-Guzik, A., Yamamoto, Y. (2012). Faster quantum chemistry simulation on fault-tolerant quantum computers. New Journal of Physics, 14, 115023. https://doi.org/10.1088/1367-2630/14/11/115023.

Kandala, A., Mezzacapo, A., Temme, K., Takita, M., Brink, M., Chow, J. M., Gambetta, J. M. (2017). Hardware-efficient Variational Quantum Eigensolver for Small Molecules and Quantum Magnets. Nature, 549, 242-246. https://doi.org/10.1038/nature23879.

Maslov, D. (2017). Basic circuit compilation techniques for an ion-trap quantum machine. New Journal of Physics, 19(2), 023035. https://doi.org/10.1088/1367-2630/aa5e47.

McArdle, S., Yuan, X., Benjamin, S. (2019). Error-mitigated digital quantum simulation. Physical Review Letters, 122(18), 180501. https://doi.org/10.1103/PhysRevLett.122.180501.

McClean, J. R., Boixo, S., Smelyanskiy, V. N., Babbush, R., Neven, H. (2018). Barren plateaus in quantum neural hetwork training landscapes. Nature Communications, 9, 4812. https://doi.org/10.1038/s41467-018-07090-4.

McClean, J. R., Schwartz, M. E., Carter, J., de Jong, W. A. (2017). Hybrid Quantum-Classical Hierarchy for Mitigation of Decoherence and Determination of Excited States. Physical Review A, 95(4), 042308. https://doi.org/10.1103/PhysRevA.95.042308.

Peruzzo, A., McClean, J., Shadbolt, P., Yung, M. H., Zhou, X. Q., Love, P. J., Aspuru-Guzik, A., & O'Brien, J. L. (2014). A variational eigenvalue solver on a photonic quantum processor. Nature Communications, 5, 4213. https://doi.org/10.1038/ncomms5213.

Shantanu, D. (2016). A Programmable Five Qubit Quantum Computer Using Trapped Atomic Ions.

Takeshita, T., Rubin, N. C., Jiang, Z., Lee, E., Babbush, R., McClean, J. R. (2020). Increasing the representation accuracy of quantum simulations of chemistry without extra quantum resources. Physical Review X, 10(1), 011004. https://doi.org/10.1103/PhysRevX.10.011004.

Wecker, D., Bauer, B., Clark, B. K., Hastings, M. B., Troyer, M. (2014). Gate count estimates for performing quantum chemistry on small quantum computers. Physical Review A, 90(2), 022305. https://doi.org/10.1103/PhysRevA.90.022305.

Welch, J., Greenbaum, D., Mostame, S., Aspuru-Guzik, A. (2014). Efficient quantum circuits for diagonal unitaries without ancillas. New Journal of Physics, 16, 033040. https://doi.org/10.1088/1367-2630/16/3/033040.

* cited by examiner

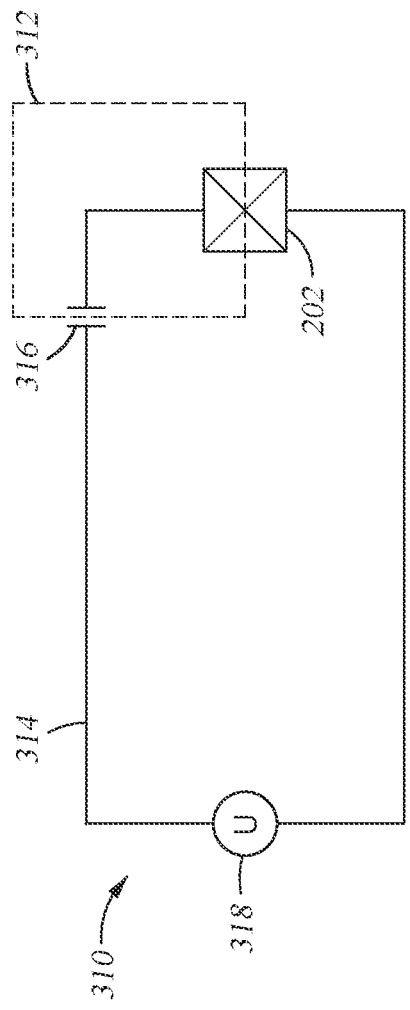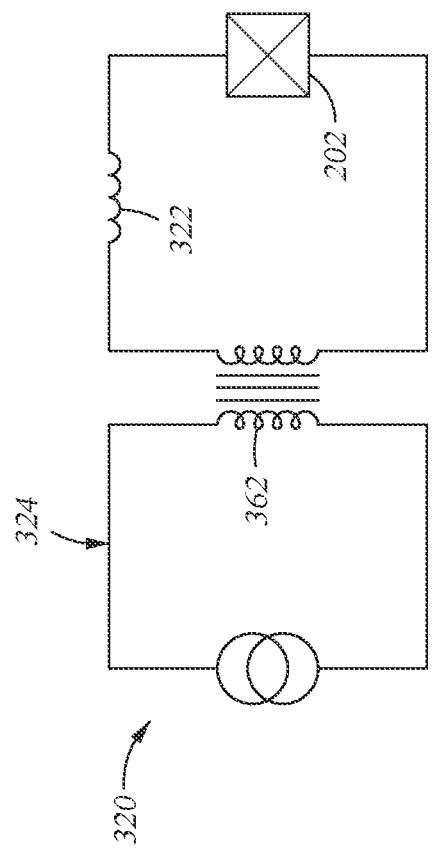
Fig. 3D
Fig. 3E

NOISE REDUCED CIRCUITS FOR SUPERCONDUCTING QUANTUM COMPUTERS

CROSS-REFERENCE TO RELATED APPLICATIONS

This application is a divisional application of U.S. patent application Ser. No. 16/867,332, filed May 5, 2020, which claims the benefit of U.S. Provisional Application No. 62/852,269, filed May 23, 2019, each of which is incorporated by reference herein.

BACKGROUND

Field

The present disclosure generally relates to a method of performing computation in a hybrid quantum-classical computing system, and more specifically, to a method of solving an optimization problem in a hybrid computing system that includes a classical computer and quantum computer that includes a series of Josephson junctions.

Description of the Related Art

In quantum computing, quantum bits or qubits, which are analogous to bits representing a "0" and a "1" in a classical (digital) computer, are required to be prepared, manipulated, and measured (read-out) with near perfect control during a computation process. Imperfect control of the qubits leads to errors that can accumulate over the computation process, limiting the size of a quantum computer that can perform reliable computations.

Among physical systems upon which it is proposed to build large-scale quantum computers is a series of Josephson junctions, each of which is formed by separating two superconducting electrodes with an insulating layer that is thin enough to allow pairs of electrons (Cooper pairs) to tunnel between the superconducting electrodes. Thus, current (referred to as Josephson current or persistent current) flows between the superconducting electrodes in the absence of a bias voltage applied between. A Josephson junction may be modelled as a non-linear resonator formed from a non-linear current-dependent inductance $L_J(I)$ in parallel with a capacitance $C_J$. The capacitance $C_J$ is determined by a ratio of the area of the Josephson junction to the thickness of the insulating layer. The inductance $L_J(I)$ is determined by the Joseph current through the insulating layer, Thus, two lowest energy states of the non-linear resonator can be used as computational states of a qubit (referred to as "qubit states"). These states can be controlled via microwave irradiation of the superconducting circuit.

In current state-of-the-art quantum computers, control of qubits is imperfect (noisy) and the number of qubits used in these quantum computers generally range from a hundred qubits to thousands of qubits. The number of quantum gates that can be used in such a quantum computer (referred to as a "noisy intermediate-scale quantum device" or "NISQ device") to construct circuits to run an algorithm within a controlled error rate is limited due to the noise.

For solving some optimization problems, a NISQ device having shallow circuits (with small number of gate operations to be executed in time-sequence) can be used in combination with a classical computer (referred to as a hybrid quantum-classical computing system). In particular, finding low-energy states of a many-particle quantum system, such as large molecules, or in finding an approximate solution to combinatorial optimization problems, a quantum subroutine, which is run on a NISQ device, can be run as part of a classical optimization routine, which is run on a classical computer. The classical computer (also referred to as a "classical optimizer") instructs a controller to prepare the NISQ device (also referred to as a "quantum processor") in an N-qubit state, execute quantum gate operations, and measure an outcome of the quantum processor. Subsequently, the classical optimizer instructs the controller to prepare the quantum processor in a slightly different N-qubit state, and repeats execution of the gate operation and measurement of the outcome. This cycle is repeated until the approximate solution can be extracted. Such hybrid quantum-classical computing system having an NISQ device may outperform classical computers in finding low-energy states of a many-particle quantum system and in finding approximate solutions to such combinatorial optimization problems. However, the number of quantum gate operations required within the quantum routine increases rapidly as the problem size increases, leading to accumulated errors in the NISQ device and causing the outcomes of these processes to be not reliable.

Therefore, there is a need for a procedure to construct shallow circuits that require a minimum number of quantum gate operations to perform computation and thus reduce noise in a hybrid quantum-classical computing system.

SUMMARY

A method of performing computation in a hybrid quantum-classical computing system includes computing, by a classical computer, a model Hamiltonian including a plurality of sub-Hamiltonian onto which a selected problem is mapped, setting a quantum processor in an initial state, where the quantum processor comprises a plurality of trapped ions, each of which has two frequency-separated states defining a qubit, transforming the quantum processor from the initial state to a trial state based on each of the plurality of sub-Hamiltonians and an initial set of variational parameters by applying a reduced trial state preparation circuit to the quantum processor, measuring an expectation value of each of the plurality of sub-Hamiltonians on the quantum processor, and determining, by the classical computer, if a difference between the measured expectation values of the model Hamiltonian in the current iteration and the previous iteration is more or less than a predetermined value. If it is determined that the difference is more than the predetermined value, the classical computer either selects another set of variational parameters based on a classical optimization method, sets the quantum processor in the initial state, transforms the quantum processor from the initial state to a new trial state based on each of the plurality of sub-Hamiltonians and the another set of variational parameters by applying a new reduced trial state preparation circuit to the quantum processor, and measures an expectation value of the each of the plurality of sub-Hamiltonians on the quantum processor after transforming the quantum processor to the new trial state. If it is determined that the difference is less than the predetermined value, the classical computer outputs the measured expectation value of the model Hamiltonian as an optimized solution to the selected problem.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3D is a schematic view of a circuit for forming a charge qubit according to one embodiment.

FIG. 3E is a schematic view of a circuit for forming a flux qubit according to one embodiment.

Figure 1:
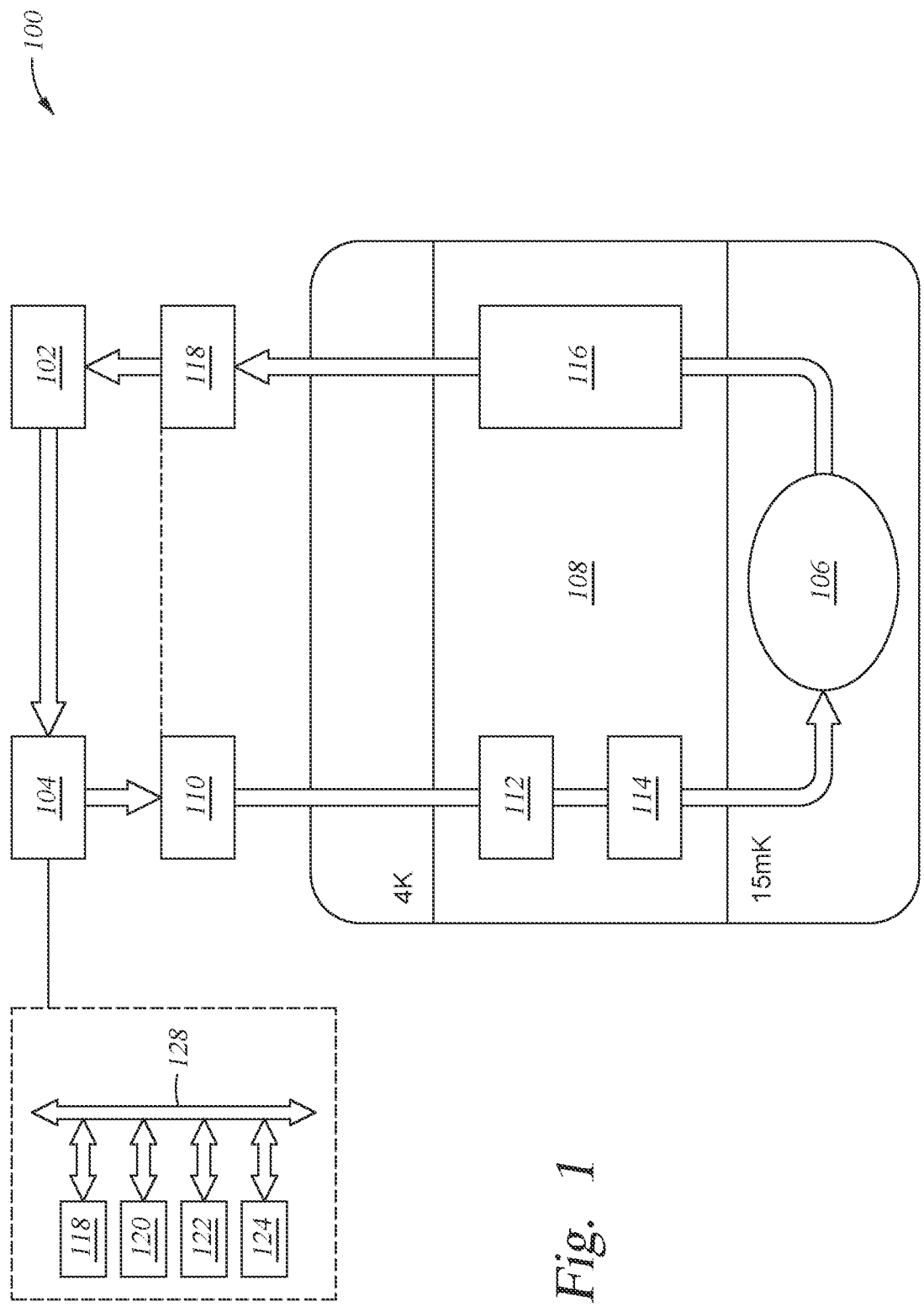
FIG. 1 is a schematic partial view of a superconducting qubit-based quantum computing system according to one embodiment.

To facilitate understanding, identical reference numerals have been used, where possible, to designate identical elements that are common to the figures. In the figures and the following description, an orthogonal coordinate system including an X-axis, a Y-axis, and a Z-axis is used. The directions represented by the arrows in the drawing are assumed to be positive directions for convenience. It is contemplated that elements disclosed in some embodiments may be beneficially utilized on other implementations without specific recitation.

DETAILED DESCRIPTION

Embodiments described herein are generally related to a method and a system for performing a computation using a hybrid quantum-classical computing system, and, more specifically, to providing an approximate solution to an optimization problem using a hybrid quantum-classical computing system that includes a series of Josephson junctions.

A hybrid quantum-classical computing system that is able to provide a solution to a combinatorial optimization problem may include a classical computer, a system controller, and a quantum processor. In some embodiments, the system controller is housed within the classical computer. The classical computer performs supporting and system control tasks including selecting a combinatorial optimization problem to be run by use of a user interface, running a classical optimization routine, translating the series of logic gates into pulses to apply on the quantum processor, and pre-calculating parameters that optimize the pulses by use of a central processing unit (CPU). A software program for performing the tasks is stored in a non-volatile memory within the classical computer.

The quantum processor includes a series of Josephson junctions that are coupled with various hardware, including microwave generators, synthesizers, mixers, and resonators to manipulate and to read-out the states of superconducting qubits. The system controller receives from the classical computer instructions for controlling the quantum processor, controls various hardware associated with controlling any and all aspects used to run the instructions for controlling the quantum processor, and returns a read-out of the quantum processor and thus output of results of the computation(s) to the classical computer.

The methods and systems described herein include an efficient method for constructing quantum gate operations executed by the quantum processor in solving a problem in a hybrid quantum-classical computing system.

General Hardware Configurations

FIG. 1 is a schematic partial view of a superconducting qubit-based quantum computing system, or system 100, according to one embodiment. The system 100 includes a classical (digital) computer 102, a system controller 104 and a quantum processor 106 located at a bottom of a dilution refrigerator 108. The classical computer 102 includes a central processing unit (CPU), memory, and support circuits (or I/O). The memory is connected to the CPU, and may be one or more of a readily available memory, such as a read-only memory (ROM), a random access memory (RAM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like.

The system controller 104 controls a microwave waveform generator 110 that includes synthesizers, waveform generators, and mixers to generate microwave pulses. These microwave pulses are filtered by a filter 112 and attenuated by an attenuator 114, and provided to the quantum processor 106 to perform operations within the quantum processor 106. Analog readout signals from the quantum processor 106 are then amplified by an amplifier 116 and digitally processed either on classical computers or in customized field programmable gate arrays (FPGAs) 118 for fast processing. The system controller 104 includes a central processing unit (CPU) 120, a read-only memory (ROM) 122, a random access memory (RAM) 124, a storage unit 126, and the like. The CPU 120 is a processor of the system controller 104. The ROM 122 stores various programs and the RAM 124 is the working memory for various programs and data. The storage unit 126 includes a nonvolatile memory, such as a hard disk drive (HDD) or a flash memory, and stores various programs even if power is turned off. The CPU 120, the ROM 122, the RAM 124, and the storage unit 126 are interconnected via a bus 128. The system controller 104 executes a control program which is stored in the ROM 122 or the storage unit 126 and uses the RAM 124 as a working area. The control program will include software applications that include program code that may be executed by processor in order to perform various functionalities associated with receiving and analyzing data and controlling any and all aspects of the methods and hardware used to create the superconducting qubit-based quantum computer system 100 discussed herein.

Figure 2:
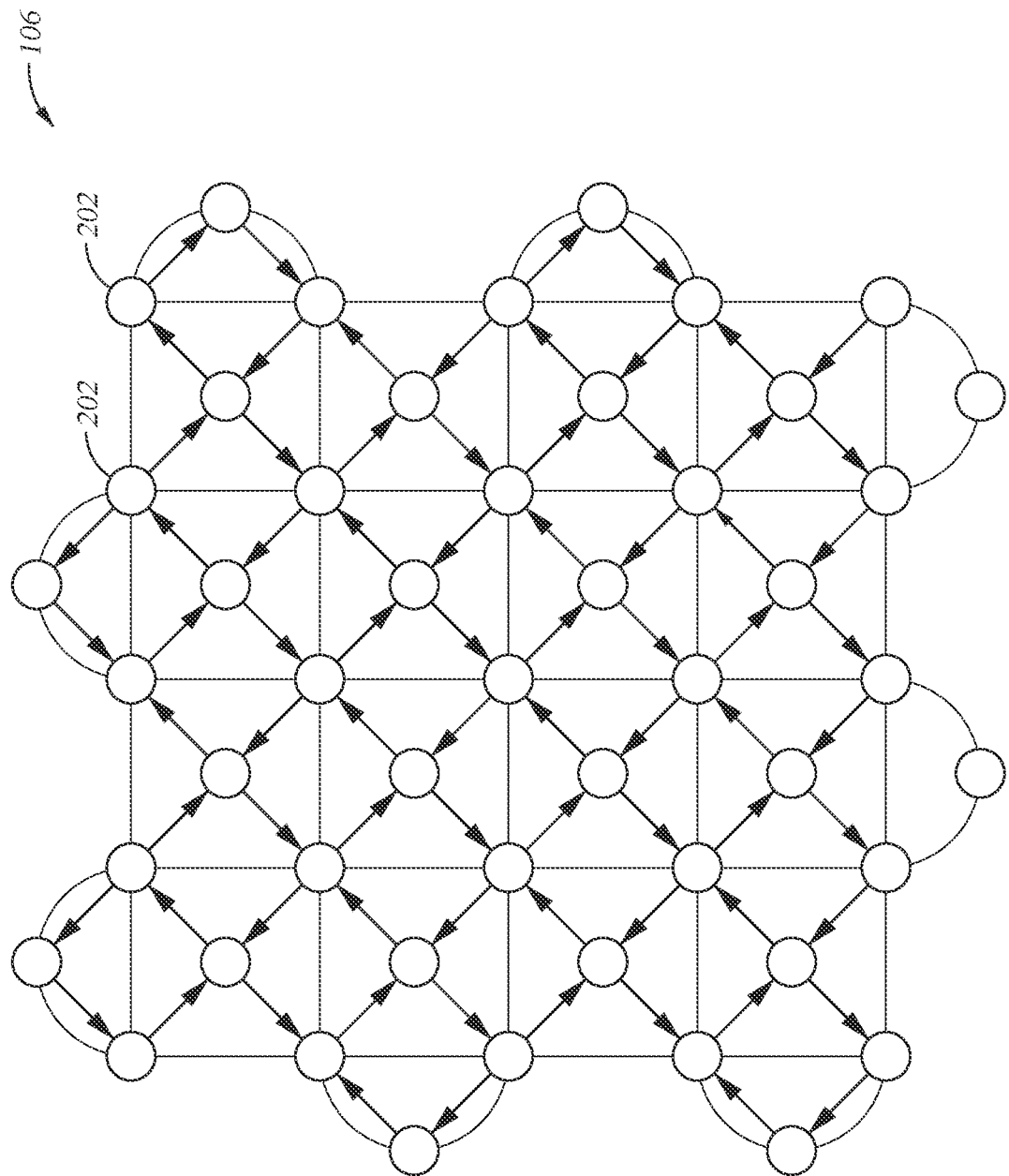
FIG. 2 depicts a schematic view of a schematic view of a quantum processor according to one embodiment.

FIG. 2 shows a schematic view of the quantum processor 106. The quantum processor 106 is a series of Josephson junctions 202, each of which is used to construct a qubit. In FIG. 2, an arrow indicates the direction of two-qubit gates, in which the arrow points from a control qubit to a target qubit (i.e., a two-qubit gate operates on the target qubit based on a state of the control qubit). An arrangement of Josephson junctions 202 in a two-dimensional square lattice form is shown as an example in FIG. 2. However, the arrangement of the Josephson junctions 202 is not limited to this example. Controls of states of the Josephson junctions 202 are performed by irradiation of the Josephson junctions 202 with microwave pulses generated by the microwave waveform generator 110 at room temperature. Noise in these controls is filtered and attenuated by the filter 112 and the attenuator 114, respectively, disposed within the dilution refrigerator 108. Signal for readout of the qubit states following a desired operation on the quantum processor 106 is amplified by the amplifier 116 disposed within the dilution refrigerator 108 and measured by a known homodyne detection technique.

Figure 3A:
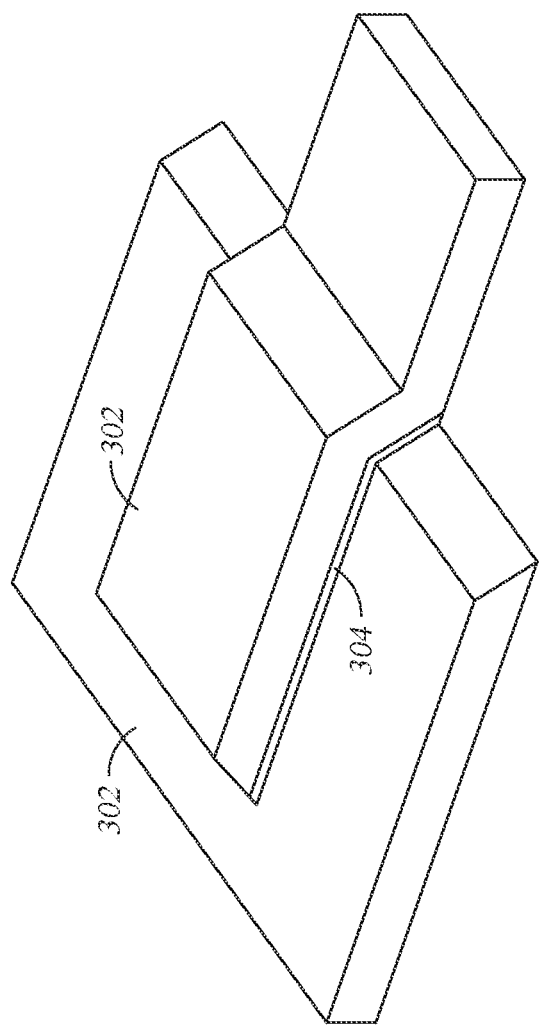
FIG. 3A is a schematic view of a Josephson junction according to one embodiment.
Figure 3C:
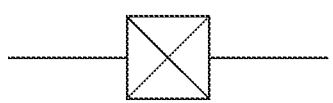
FIGS. 3B and 3C are schematic models of a Josephson junction according to one embodiment.
Figure 3B:
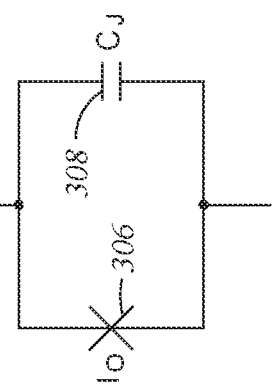

FIG. 3A is a schematic view of each Josephson junction 202 including two superconducting electrodes 302 with an insulating layer 304 between the two superconducting electrodes 302. The insulating layer 304 is thin enough to allow pairs of electrons (Cooper pairs) to tunnel between the superconducting electrodes 302. Thus, current (Josephson current) flows between the superconducting electrodes 302 even in the absence of a bias voltage applied in-between. A Josephson junction 202 can be modelled as a non-linear resonator formed from a non-linear current-dependent inductor 306 in parallel with a capacitor 308 as shown in FIG. 3B This combination of the inductor 306 and the capacitor 308 may be drawn as a single element for simplicity as shown in FIG. 3C. The capacitance C of the capacitor 308 is determined by a ratio of the area of the Josephson junction 202 to the thickness of the insulating layer 304. The inductance L (I) of the inductor 306 is determined by the current through the insulating layer 304, As LC circuits are generally known to mathematically correspond to harmonic oscillators, and thus have discrete energy states, two lowest energy states of the non-linear resonator can be used as computational states of a qubit (referred to as "qubit states"). These states can be controlled via microwave pulses generated by the microwave waveform generator 110.

A Josephson junction 202 (a non-linear resonator) can provide three qubit archetypes, charge qubits, flux qubits, and phase qubits, and their variants (e.g., Fluxonium, Transmon, Xmon, Quantronium) depending on a circuit 310 to which the Josephson junction 202 is connected. For any qubit archetypes, qubit states are mapped to different states of the non-linear resonator, for example, discrete energy states of the non-linear resonator or to their quantum superpositions. For example, in a charge qubit as shown in FIG. 3D, the different energy levels correspond to different integer numbers of Cooper pairs on a superconducting island 312 (encircled with a dashed line) defined between a lead 314 of a capacitor 316 and a Josephson junction 202. The lowest-lying states are used as qubit states. A gate voltage 318 capacitively coupled the superconducting island 312 controls an offset in the number of Cooper pairs in the superconducting island 312. In a flux qubit as shown in FIG. 3F, the different energy levels correspond to different integer numbers of magnetic flux quanta trapped in a superconducting loop 320 including an inductor 322 and one or more Josephson junctions 202. In the superconducting loop 320, persistent current flows clockwisely and counter-clockwisely when an external magnetic flux is applied by an inductively coupled superconducting quantum interference device (DC-SQUID) 324 through a coil 362. When the external magnetic flux is close to a half integer number of magnetic flux quanta, the two lowest-lying states are symmetric and anti-symmetric superposition states of a clockwise persistent current state and a counter-clockwise persistent current state and are be used as qubit states.

Figure 4:
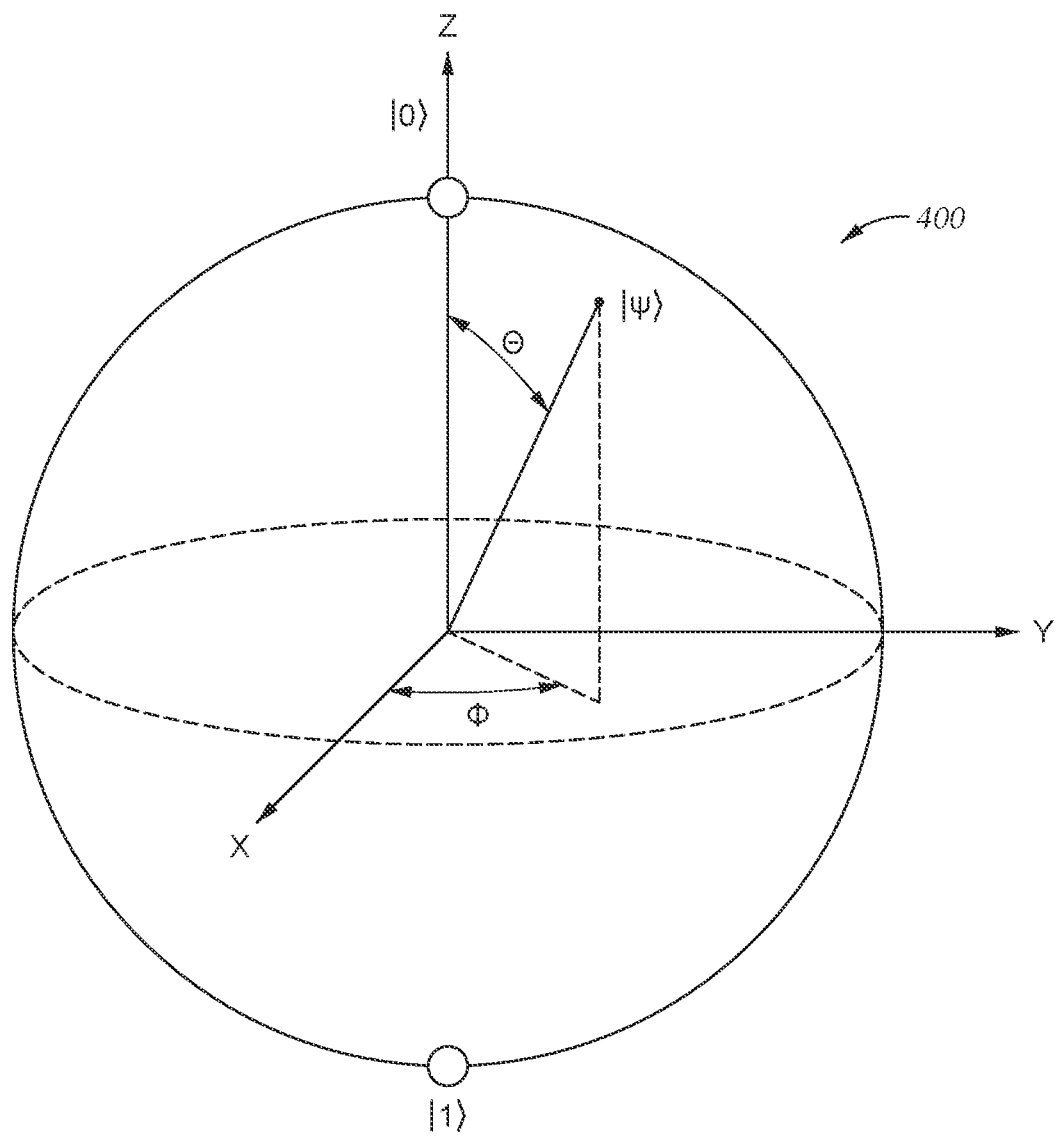
FIG. 4 depicts a qubit state of a superconducting qubit represented as a point on a surface of the Bloch sphere.

FIG. 4 is provided to help visualize a qubit state of a superconducting qubit is represented as a point on a surface of the Bloch sphere 400 with an azimuthal angle c and a polar angle θ. Application of the composite pulse as described above, causes Rabi flopping between the qubit state |1⟩ (represented as the north pole of the Bloch sphere) and |1⟩ (the south pole of the Bloch sphere) to occur. Adjusting time duration and amplitudes of the composite pulse flips the qubit state from |1⟩ to |1⟩ (i.e., from the north pole to the south pole of the Bloch sphere), or the qubit state from |1⟩ to |1⟩ (i.e., from the south pole to the north pole of the Bloch sphere). This application of the composite pulse is referred to as a "π-pulse". Further, by adjusting time duration and amplitudes of the composite pulse, the qubit state |1⟩ may be transformed to a superposition state |0⟩+|1⟩, where the two qubit states |1⟩ and |1⟩ are added and equally-weighted in-phase (a normalization factor of the superposition state is omitted hereinafter without loss of generality) and the qubit state |1⟩ to a superposition state |0⟩−|1⟩, where the two qubit states |1⟩ and |1⟩ are added equally-weighted but out of phase. This application of the composite pulse is referred to as a "π/2-pulse". More generally, a superposition of the two qubits states |1⟩ and |1⟩ that are added and equally-weighted is represented by a point that lies on the equator of the Bloch sphere. For example, the superposition states |0⟩±|1⟩ correspond to points on the equator with the azimuthal angle φ being zero and π, respectively. The superposition states that correspond to points on the equator with the azimuthal angle φ are denoted as |0⟩+$e^{i\phi}$|1⟩ (e.g., |1⟩±i|1⟩ for φ=±π/2). Transformation between two points on the equator (i.e., a rotation about the Z-axis on the Bloch sphere) can be implemented by shifting phases of the composite pulse.

Entanglement Formation

Superconducting qubits can be coupled with their neighboring superconducting qubits. In the charge qubits, neighboring qubits can be coupled capacitively, either directly or indirectly mediated by a resonator, which generates interaction between the neighboring charge qubits. The strength of the interaction between the neighboring charge qubits can be tuned by changing the strength of the capacitive coupling, and in case of the indirect mediation, a frequency detuning between the qubits and the resonator.

In the flux qubits, neighboring qubits can be coupled inductively resulting in interaction between the neighboring flux qubits. The strength of the interaction between the neighboring flux qubits can be tuned by dynamically tuning frequency between qubit states of the flux qubits or frequency of some separate sub-circuit, or by using microwave pulses. Example methods known in the art for tuning of the strength of interaction between neighboring superconducting qubits include the direct-resonant iSWAP, the higher-level resonance induced dynamical c-Phase (DP), the resonator sideband induced iSWAP, the cross-resonance (CR) gate, the Bell-Rabi, the microwave activated phase gate, and the driven resonator induced c-Phase (RIP).

By controlling the interaction between two neighboring superconducting qubits (i-th and j-th qubits) as described above in combination with single qubit gates, a two-qubit entanglement gate operation, such as a controlled-NOT operation, or a controlled-Z operation, may be performed on the two neighboring superconducting qubits (i-th and j-th qubits).

The entanglement interaction between two qubits described above can be used to perform a two-qubit entanglement gate operation. The two-qubit entanglement gate operation (entangling gate) along with single-qubit operations (R gates) forms a set of gates that can be used to build a quantum computer that is configured to perform desired computational processes. Here, the R gate corresponds to manipulation of individual states of superconducting qubits, and the two-qubit entanglement gate (also referred to as an "entangling gate") corresponds to manipulation of the entanglement of two neighboring superconducting qubits.

Hybrid Quantum-Classical Computing System

While currently available quantum computers may be noisy and prone to errors, a combination of both quantum and classical computers, in which a quantum computer is a domain-specific accelerator, may be able to solve optimization problems that are beyond the reach of classical computers. An example of such optimization problems is quantum chemistry, where Variational Quantum Eigensolver (VQE) algorithms perform a search for the lowest energy (or an energy closest to the lowest energy) of a many-particle quantum system and the corresponding state (e.g. a configuration of the interacting electrons or spins) by iterating computations between a quantum processor and a classical computer. A many-particle quantum system in quantum theory is described by a model Hamiltonian and the energy of the many-particle quantum system corresponds to the expectation value of the model Hamiltonian. In such algorithms, a configuration of electrons or spins that is best known approximation calculated by the classical computer is input to the quantum processor as a trial state and the energy of the trial state is estimated using the quantum processor. The classical computer receives this estimate, modifies the trial state by a known classical optimization algorithm, and returns the modified trial state back to the quantum processor. This iteration is repeated until the estimate received from the quantum processor is within a predetermined accuracy. A trial function (i.e., a possible configuration of electrons or spins of the many-particle quantum system) would require exponentially large resource to represent on a classical computer, as the number of electrons or spins of the many-particle quantum system of interest, but only require linearly-increasing resource on a quantum processor. Thus, the quantum processor acts as an accelerator for the energy estimation sub-routine of the computation. By solving for a configuration of electrons or spins having the lowest energy under different configurations and constraints, a range of molecular reactions can be explored as part of the solution to this type of optimization problem for example.

Another example optimization problem is in solving combinatorial optimization problems, where Quantum Approximate Optimization Algorithm (QAOA) perform search for optimal solutions from a set of possible solutions according to some given criteria, using a quantum computer and a classical computer. The combinatorial optimization problems that can be solved by the methods described herein may include the PageRank (PR) problem for ranking web pages in search engine results and the maximum-cut (MaxCut) problem with applications in clustering, network science, and statistical physics. The MaxCut problem aims at grouping nodes of a graph into two partitions by cutting across links between them in such a way that a weighted sum of intersected edges is maximized. The combinatorial optimization problems that can be solved by the methods described herein may further include the travelling salesman problem for finding shortest and/or cheapest round trips visiting all given cities. The travelling salesman problem is applied to scheduling a printing press for a periodical with multi-editions, scheduling school buses minimizing the number of routes and total distance while no bus is overloaded or exceeds a maximum allowed policy, scheduling a crew of messengers to pick up deposit from branch banks and return the deposit to a central bank, determining an optimal path for each army planner to accomplish the goals of the mission in minimum possible time, designing global navigation satellite system (GNSS) surveying networks, and the like. Another combinatorial optimization problem is the knapsack problem to find a way to pack a knapsack to get the maximum total value, given some items. The knapsack problem is applied to resource allocation given financial constraints in home energy management, network selection for mobile nodes, cognitive radio networks, sensor selection in distributed multiple radar, or the like.

A combinatorial optimization problem is modeled by an objective function (also referred to as a cost function) that maps events or values of one or more variables onto real numbers representing "cost" associated with the events or values and seeks to minimize the cost function. In some cases, the combinatorial optimization problem may seek to maximize the objective function. The combinatorial optimization problem is further mapped onto a simple physical system described by a model Hamiltonian (corresponding to the sum of kinetic energy and potential energy of all particles in the system) and the problem seeks the low-lying energy state of the physical system, as in the case of the Variational Quantum Eigensolver (VQE) algorithm.

This hybrid quantum-classical computing system has at least the following advantages. First, an initial guess is derived from a classical computer, and thus the initial guess does not need to be constructed in a quantum processor that may not be reliable due to inherent and unwanted noise in the system. Second, a quantum processor performs a small-sized (e.g., between a hundred qubits an a few thousand qubits) but accelerated operation (that can be performed using a small number of quantum logic gates) between an input of a guess from the classical computer and a measurement of a resulting state, and thus a NISQ device can execute the operation without accumulating errors. Thus, the hybrid quantum-classical computing system may allow challenging problems to be solved, such as small but challenging combinatorial optimization problems, which are not practically feasible on classical computers, or suggest ways to speed up the computation with respect to the results that would be achieved using the best known classical algorithm.

Figure 5:
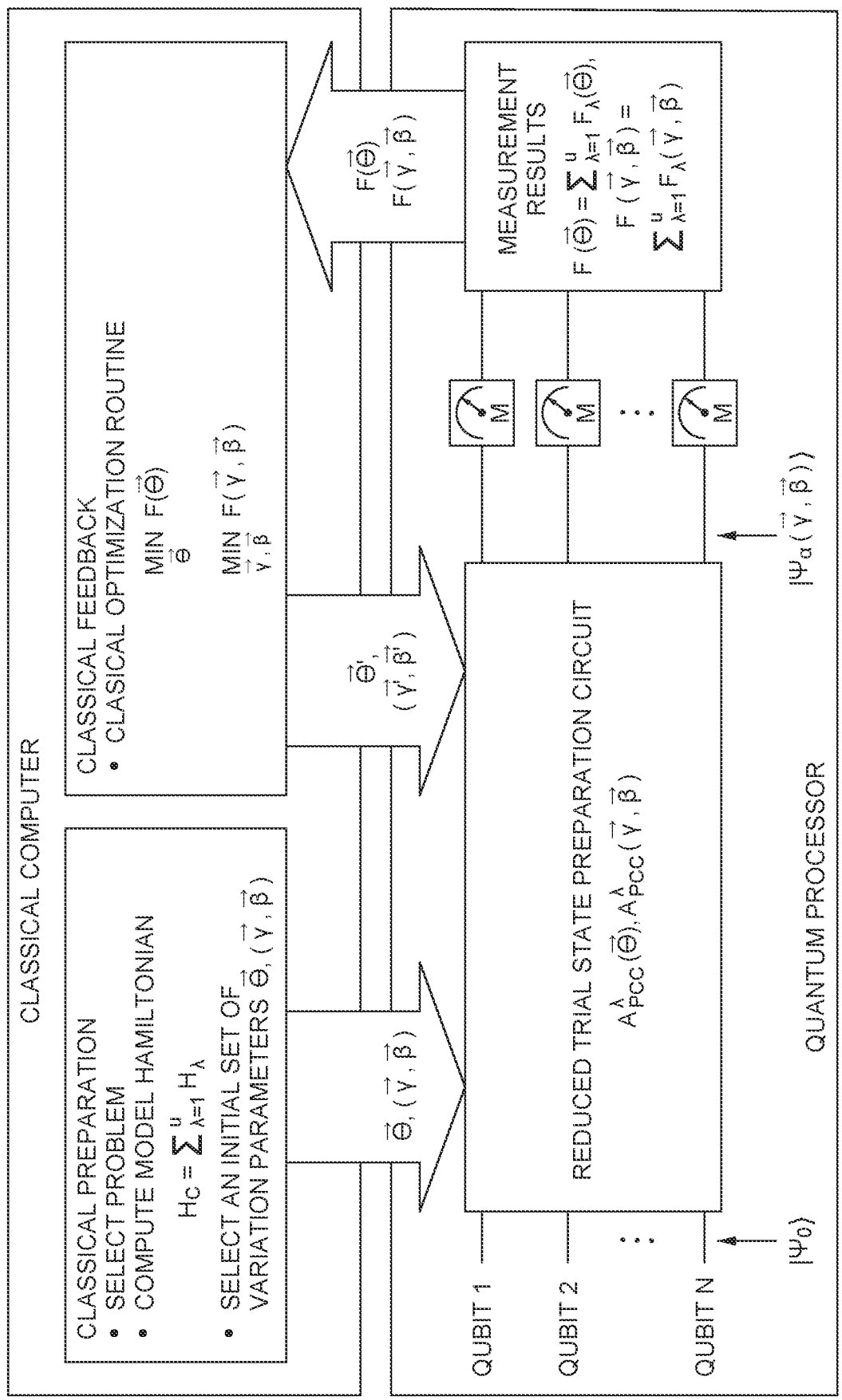
FIG. 5 depicts an overall hybrid quantum-classical computing system for obtaining a solution to an optimization problem by Variational Quantum Eigensolver (VQE) algorithm or Quantum Approximate Optimization Algorithm (QAOA) according to one embodiment.
Figure 6:
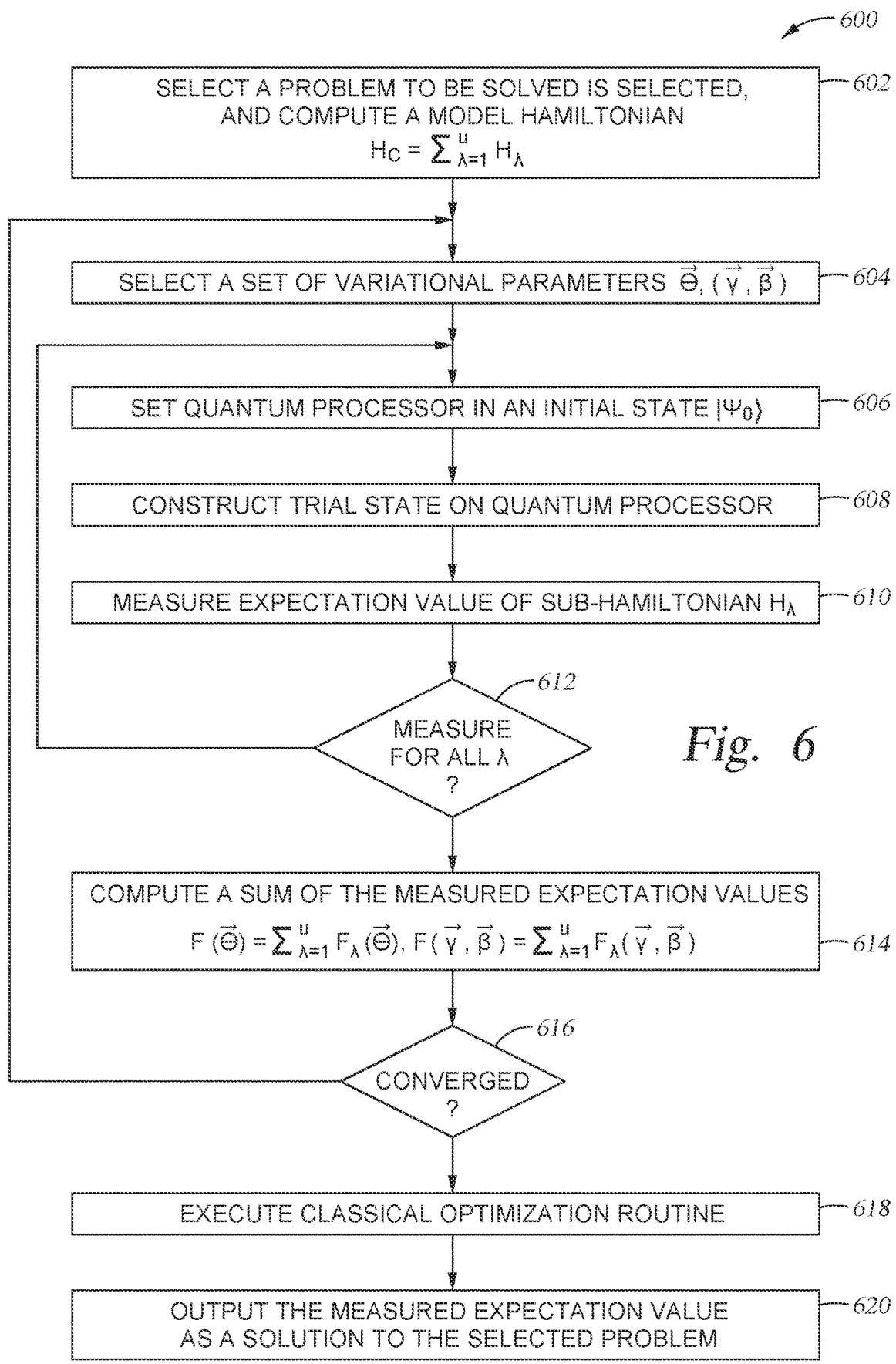
FIG. 6 depicts a flowchart illustrating a method of obtaining a solution to an optimization problem by Variational Quantum Eigensolver (VQE) algorithm or Quantum Approximate Optimization Algorithm (QAOA) according to one embodiment.

FIGS. 5 and 6 depict an overall hybrid quantum-classical computing system 500 and a flowchart illustrating a method 600 of obtaining a solution to an optimization problem by Variational Quantum Eigensolver (VQE) algorithm or Quantum Approximate Optimization Algorithm (QAOA) according to one embodiment. In this example, the quantum processor 106 is a series of N Josephson junctions 202.

The VQE algorithm relies on a variational search by the well-known Rayleigh-Ritz variational principle. This principle can be used both for solving quantum chemistry problems by the VQE algorithm and combinatorial optimization problems solved by the QAOA. The variational method consists of iterations that include choosing a "trial state" of the quantum processor depending on a set of one or more parameters (referred to as "variational parameters") and measuring an expectation value of the model Hamiltonian (e.g., energy) of the trial state. A set of variational parameters (and thus a corresponding trial state) is adjusted and an optimal set of variational parameters are found that minimizes the expectation value of the model Hamiltonian (the energy). The resulting energy is an approximation to the exact lowest energy state. As the processes for obtaining a solution to an optimization problem by the VQE algorithm and by the QAOA, the both processes are described in parallel below.

In block 602, by the classical computer 102, an optimization problem to be solved by the VQE algorithm or the QAOA is selected, for example, by use of a user interface of the classical computer 102, or retrieved from the memory of the classical computer 102, and a model Hamiltonian $H_C$, which describes a many-particle quantum system in the quantum chemistry problem, or to which the selected combinatorial optimization problem is mapped, is computed.

In a quantum chemistry problem defined on an N-spin system, the system can be well described by a model Hamiltonian that includes quantum spins (each denoted by the third Pauli matrix $\sigma_i^z$) ($i=1, 2, \ldots, N$) and couplings among the quantum spins $\sigma_i^z$, $H_C = \Sigma_{\alpha=1}^t h_\alpha P_\alpha$, where $P_\alpha$ is a Pauli string (also referred to as a Pauli term) $P_\alpha = \sigma_1^{\alpha_1} \otimes \sigma_2^{\alpha_2} \otimes \ldots \sigma_N^{\alpha_N}$ and $\sigma_i^{\alpha_1}$ is either the identity operator I or the Pauli matrix $\sigma_i^X$, $\sigma_i^Y$, or $\sigma_i^z$. Here t stands for the number of couplings among the quantum spins and $h_\alpha$ ($\alpha=1, 2, \ldots, t$) stands for the strength of the coupling $\alpha$. An N-electron system can be also described by the same model Hamiltonian $H_C = \Sigma_{\alpha=1}^t h_\alpha P_\alpha$. The goal is to find low-lying energy states of the model Hamiltonian $H_C$.

In a combinatorial optimization problem defined on a set of N binary variables with t constrains ($\alpha=1, 2, \ldots, t$), the objective function is the number of satisfied clauses $C(z) = \Sigma_{\alpha=1}^t C_\alpha(z)$ or a weighted sum of satisfied clauses $C(z) = \Sigma_{\alpha=1}^t h_\alpha C_\alpha(z)$ ($h_\alpha$ corresponds to a weight for each constraint $\alpha$), where $z=z_1 z_2 \ldots z_N$ is a N-bit string and $C_\alpha(z)=1$ if z satisfies the constraint $\alpha$. The clause $C_\alpha(z)$ that describes the constraint $\alpha$ typically includes a small number of variables $z_i$. The goal is to minimize the objective function. Minimizing this objective function can be converted to finding a low-lying energy state of a model Hamiltonian $H_C = \Sigma_{\alpha1}^t h_\alpha P_\alpha$ by mapping each binary variable $z_i$ to a quantum spin $\sigma_i^z$ and the constraints to the couplings among the quantum spins $\sigma_i^z$, where $P_\alpha$ is a Pauli string (also referred to as a Pauli term) $P_\alpha = \sigma_1^{\alpha_1} \otimes \sigma_2^{\alpha_2} \otimes \ldots \sigma_N^{\alpha_N}$ and $\sigma_i^{\alpha_i}$ is either the identity operator I or the Pauli matrix $\sigma_i^X$, $\sigma_i^Y$, or $\sigma_i^z$. Here t stands for the number of couplings among the quantum spins and $h_\alpha$ ($\alpha=1, 2, \ldots, t$) stands for the strength of the coupling $\alpha$.

The quantum processor 106 has N qubits and each quantum spin $\sigma_i^z$ ($i=1, 2, \ldots, N$) is encoded in qubit i ($i=1, 2, \ldots, N$) in the quantum processor 106. For example, the spin-up and spin-down states of the quantum spin $\sigma_i^z$ are encoded as $|0\rangle$ and $|1\rangle$ of the qubit i.

In block 604, following the mapping of the selected combinatorial optimization problem onto a model Hamiltonian $H_C = \Sigma_{\alpha1}^t h_\alpha P_\alpha$, a set of variational parameters ($\vec{\theta} = \theta_1, \theta_2, \ldots, \theta_N$ for the VQE algorithm, ($\vec{\gamma} = \gamma_1, \ldots \gamma_2, \ldots, \gamma_p$, $\vec{\beta} = \beta_1, \beta_2, \ldots, \beta_p$) for the QAOA) is selected, by the classical computer 102, to construct a sequence of gates (also referred to a "trial state preparation circuit") $A(\vec{\theta})$ for the VQE or $A(\vec{\gamma}, \vec{\beta})$ for the QAOA, which prepares the quantum processor 106 in a trial state $|\Psi(\vec{\theta})\rangle$ for the VQE or $|(\vec{\gamma}, \vec{\beta})\rangle$ for the QAOA. For the initial iteration, a set of variational parameters $\vec{\theta}$ in the VQE may be chosen randomly. In the QAOA, a set of variational parameters $(\vec{\gamma}, \vec{\beta})$ may be randomly chosen for the initial iteration.

This trial state $|\Psi(\vec{\theta})\rangle$, $|\Psi(\vec{\gamma}, \vec{\beta})\rangle$ is used to provide an expectation value of the model Hamiltonian $H_C$.

In the VQE algorithm, the trial state preparation circuit $A(\vec{\theta})$ may be constructed by known methods, such as the unitary coupled cluster method, based on the model Hamiltonian $H_C$ and the selected set of variational parameters $\vec{\theta}$.

In the QAOA, the trial state preparation circuit $A(\vec{\gamma}, \vec{\beta})$ includes p layers (i.e., p-time repetitions) of an entangling circuit $U(\gamma_l)$ that relates to the model Hamiltonian $H_C$ ($U(\gamma_l) = e^{-i\gamma_l H_C}$) and a mixing circuit $U_{Mix}(\beta_l)$ that relates to a mixing term $H_B = \Sigma_{i=1}^n \sigma_i^X$ ($U_{Mix}(\beta_l) = e^{-i\beta_l H_B}$) ($l=1, 2, \ldots, p$) as $$A(\vec{\gamma}, \vec{\beta}) = U_{Mix}(\beta_p) U_{Mix}(\beta_{p-1}) U(\beta_{p-1}) \ldots U_{Mix}(\beta_1) U(\gamma_1).$$

Each term $\sigma_i^X$ (in the mixing term $H_B$ corresponds to a $\pi/2$-pulse (as described above in relation to FIG. 4) applied to qubit i in the quantum processor 106.

To allow the application of the trial state preparation circuit $A(\vec{\theta})$, $A(\vec{\gamma}, \vec{\beta})$ on a NISQ device, the number of the quantum gate operations need to be small (i.e., shallow circuits) such that errors due to the noise in the NISQ device are not accumulated. However, as the problem size increases, the complexity of the trial state preparation circuit $A(\vec{\theta})$, $A(\vec{\gamma}, \vec{\beta})$ may increase rapidly, leading to deep circuits (i.e., an increased number of time steps required to execute gate operations in circuits to construct) required to construct the trial state preparation circuit $A(\vec{\theta})$, $A(\vec{\gamma}, \vec{\beta})$. Furthermore, some trial state preparation circuit $A(\vec{\theta})$, $A(\vec{\gamma}, \vec{\beta})$ that are designed hardware-efficiently with shallow circuits (i.e., a decreased number of time steps required to execute gate operations) may not provide a large enough variational search space to find the lowest energy of the model Hamiltonian $H_C$. In the embodiments described herein, the terms in the model Hamiltonian $H_C$ are grouped into sub-Hamiltonians $H_\lambda = 1, 2, \ldots, u$), where u is the number of sub-Hamiltonians (i.e., $H_C = \Sigma_{\lambda=1}^u H_\lambda$), and the trial state preparation circuit $A(\vec{\theta})$, $A(\vec{\gamma}, \vec{\beta})$ is replaced with a reduced state preparation circuit $A_{PCC}^\lambda(\vec{\theta})$, $A_{PCC}^\lambda(\vec{\gamma}, \vec{\beta})$ to evaluate an expectation value of each sub-Hamiltonian $H_\lambda$. The reduced state preparation circuit $A_{PCC}^\lambda(\vec{\theta})$, $A_{PCC}^\lambda(\vec{\gamma}, \vec{\beta})$ for a sub-Hamiltonian $H_\lambda$ is constructed by a set of gate operations that can influence an expectation value of the sub-Hamiltonian $H_\lambda$ (referred to as the past causal cone (PCC) of the sub-Hamiltonian). Other gate operations (that do not influence the expectation value of the sub-Hamiltonian $H_\lambda$) in the trial state preparation circuit $A(\vec{\theta})$, $A(\vec{\gamma}, \vec{\beta})$ are removed in the reduced state preparation circuits $A_{PCC}^\lambda(\vec{\theta})$ $A_{PCC}^\lambda(\vec{\gamma}, \vec{\beta})$. In some embodiments, sub-Hamiltonians $H_\lambda$ of the model Hamiltonian $H_C$ may respectively correspond to Pauli terms $P_\alpha$ in the model Hamiltonian $H_C$. In some embodiments, a sub-Hamiltonian $H_\lambda$ is a collection of more than one Pauli terms $P_\alpha$ in the model Hamiltonian $H_C$.

Figure 7A:
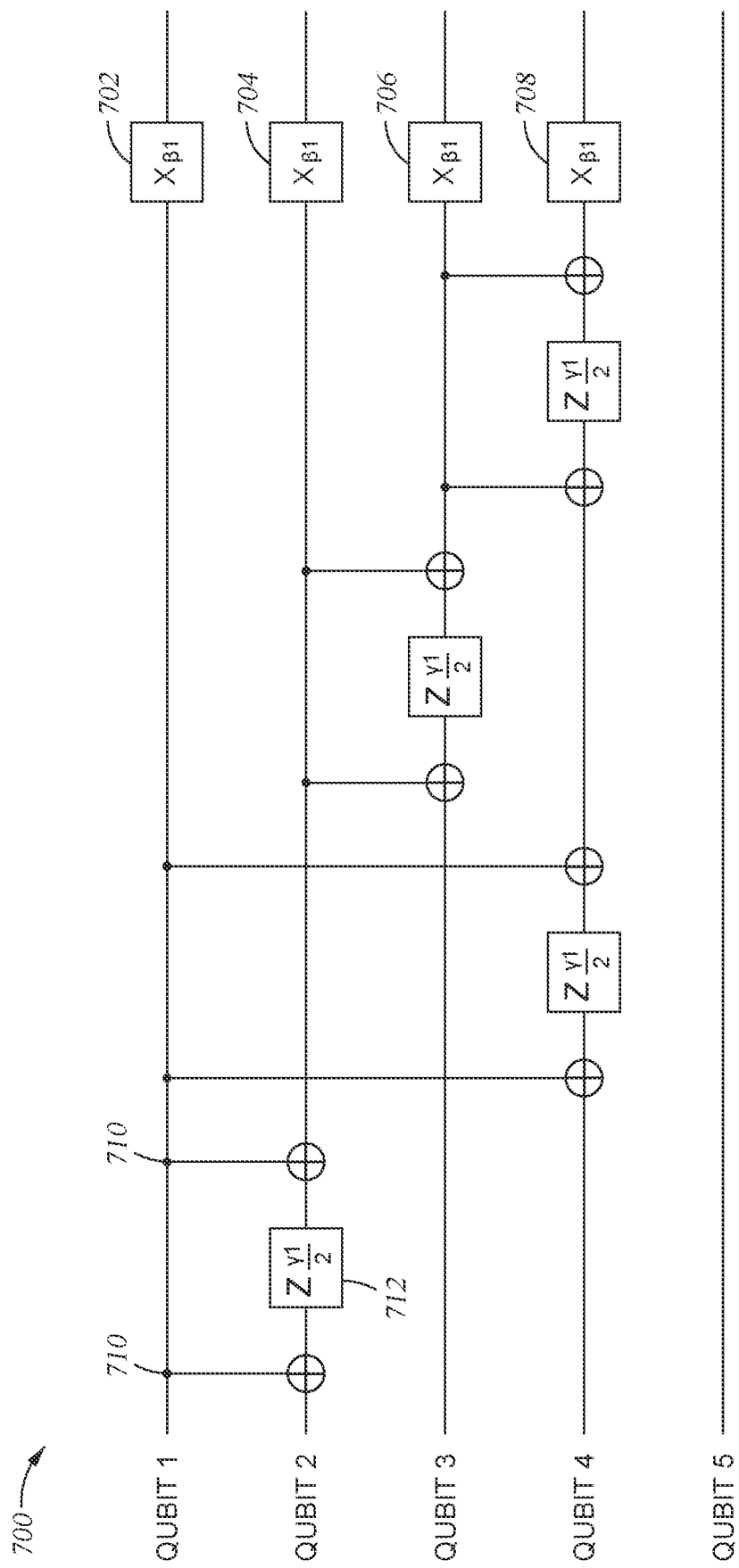
FIG. 7A illustrates a trial state preparation circuit according to one embodiment.
Figure 7B:
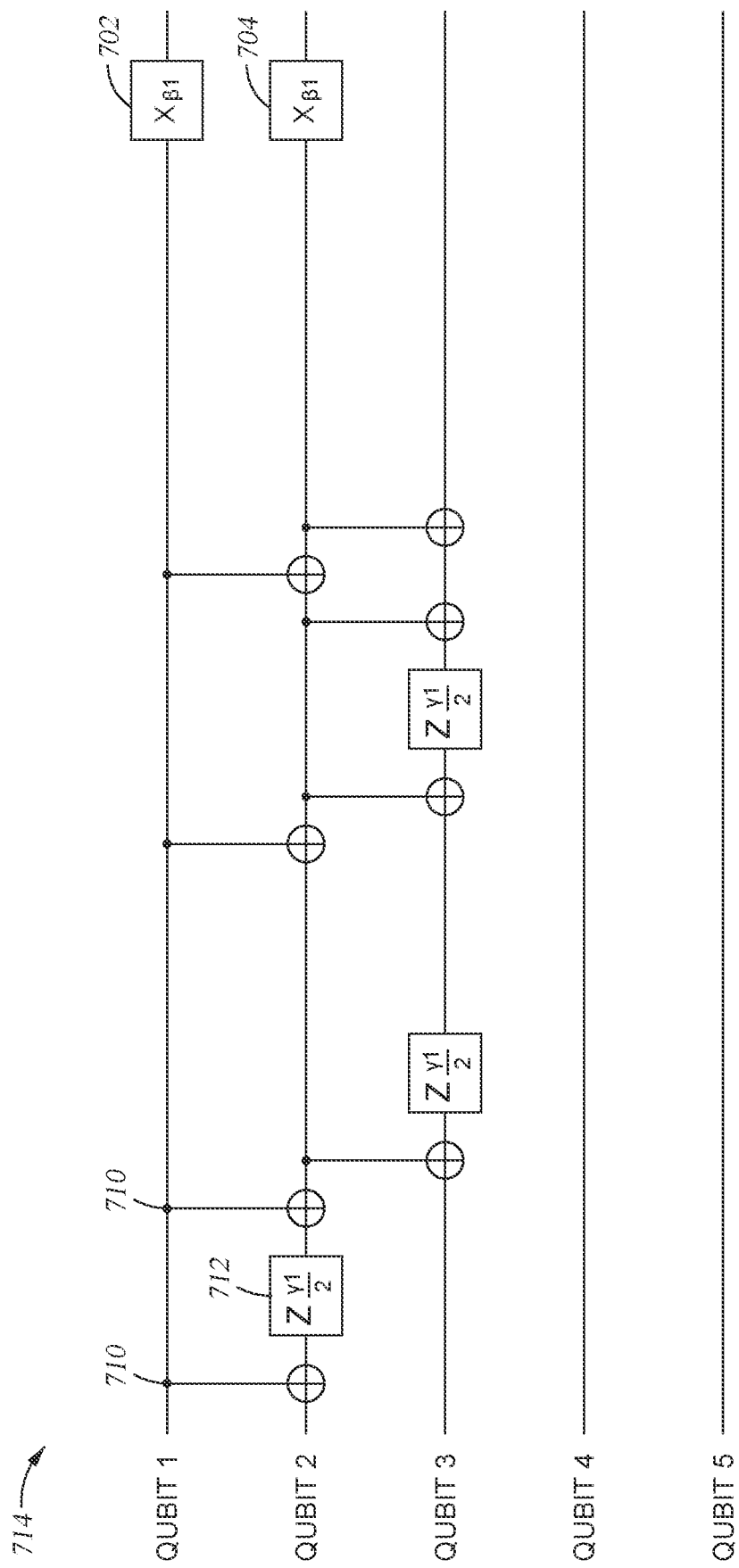
FIG. 7B illustrates reduced trial state preparation circuits according to one embodiment.

For example, the model Hamiltonian $H_C = \sigma_1^Z \otimes \sigma_2^Z + \sigma_2^Z \otimes \sigma_3^Z + \sigma_3^Z \otimes \sigma_4^Z + \sigma_1^Z \otimes \sigma_4^Z$ may be grouped into four sub-Hamiltonians, $H_1 = \sigma_1^Z \otimes \sigma_2^Z$, $H_2 = \sigma_2^Z \otimes \sigma_3^Z$, $H_3 = \sigma_3^Z \otimes \sigma_4^Z$, and $H_4 = \sigma_1^Z \otimes \sigma_4^Z$. This model Hamiltonian may be defined on a system of five superconducting qubits (qubit 1, 2, ..., 5) aligned in a one dimensional array, in which two-qubit gates can be applied between neighboring pairs of qubits (1, 2), (2, 3), (3, 4), (4, 5). FIG. 7A illustrates the trial state preparation circuit $(A(\vec{\gamma}, \vec{\beta}) = U(\gamma_1) U_{Mix}(\beta_1))$ 700, where p=1. The mixing circuit $U_{Mix}(\beta_j)$ can be implemented by single-qubit rotation gates 702, 704, 706, 708 on qubits 1, 2, 3, and 4, respectively. The entangling circuit $U(\gamma_1)$ is related to the model Hamiltonian $H_C$ as described above. The first term $\sigma_1^Z \otimes \sigma_2^Z$ in the model Hamiltonian $H_C$ can be implemented in combination of controlled-NOT gates 710 on qubit 2 conditioned on qubit 1 and targeted on qubit 2, and a single-qubit rotation gate 712 on qubit 2 about the Z-axis of the Bloch sphere 400 by a polar angle $\gamma_1/2$. As one will appreciate, the implementation of such gates can be performed by combining properly adjusted entangling interaction gate operation between qubits 1 and 2 and composite pulses applied to qubits 1 and 2. The terms $\sigma_2^Z \otimes \sigma_3^Z$ and $\sigma_3^Z \otimes \sigma_4^Z$ in the model Hamiltonian $H_C$ can be implemented similarly. The last term $\sigma_1^Z \otimes \sigma_4^Z$ in the model Hamiltonian $H_C$ can be implemented in combination of controlled-NOT gates conditioned on qubit 1 and targeted on qubit 2, controlled-NOT gates conditioned on qubit 2 and targeted on qubit 3, controlled-NOT gates conditioned on qubit 3 and targeted on qubit 4, and controlled-NOT gates conditioned on qubit 4 and targeted on qubit 5 and single-qubit rotation gates on qubits 1, 2, 3, 4, and 5. FIG. 7B illustrates the reduced state preparation circuits $(A_{PCC}^1(\vec{\gamma}, \vec{\beta}))$ 714 to evaluate an expectation value of the sub-Hamiltonian $H_1 = \sigma_1^Z \otimes \sigma_2^Z$. Since qubits 3 and 4 do not affect the expectation value of the sub-Hamiltonian $H_1 = \sigma_1^Z \otimes \sigma_2^Z$, the controlled-NOT gates and the single-qubit rotation gates that are applied only to qubits 3 and 4 in the trial state preparation circuit $A(\vec{\gamma}, \vec{\beta})$ are removed. The reduced state preparation circuits $A_{PCC}^\lambda(\vec{\gamma}, \vec{\beta})$ to evaluate an expectation value of other sub-Hamiltonians $H_\lambda$ can be constructed similarly.

With the reduced trial state preparation circuit $A_{PCC}^\lambda(\vec{\theta})$, $A_{PCC}^\lambda(\vec{\gamma}, \vec{\beta})$ for a sub-Hamiltonian $H_\lambda$, a trial state $|\Psi_\lambda(\vec{\theta})\rangle$, $|\Psi_\lambda(\vec{\gamma}, \vec{\beta})\rangle$ is prepared on the quantum processor 106 to evaluate an expectation of the sub-Hamiltonian $H_A$. This step is repeated for all of the sub-Hamiltonians $H_\lambda$ ($\lambda$=1, 2, ..., u). The expectation value of the model Hamiltonian $H_C$ is a sum of the expectation values of all of the sub-Hamiltonians $H_\lambda$ ($\lambda$=1, 2, ..., u). The use of the reduced trial state preparation circuit $A_{PCC}^\lambda(\vec{\theta})$, $A_{PCC}^\lambda(\vec{\gamma}, \vec{\beta})$ reduces the number of gate operations to apply on the quantum processor 106. Thus, a trial state $|\Psi_\lambda(\vec{\theta})\rangle$, $|\Psi_\lambda(\vec{\gamma}, \vec{\beta})\rangle$ can be constructed without accumulating errors due to the noise in the NISQ device.

In block 606, following the selection of a set of variational parameters $\vec{\theta}$, $(\vec{\gamma}, \vec{\beta})$, the quantum processor 106 is set in an initial state $|\Psi_0\rangle$ by the system controller 104. In the VQE algorithm, the initial state $|\Psi_0\rangle$ may correspond to an approximate ground state of the system that is calculated by a classical computer or an approximate ground state that is empirically known to one in the art. In the QAOA algorithm, the initial state $|\Psi_0\rangle$ may be in the hyperfine ground state of the quantum processor 106 (in which all qubits are in the uniform superposition over computational basis states (in which all qubits are in the superposition of $|0\rangle$ and $|1\rangle$ $|0\rangle+|1\rangle$)). A qubit can be set in the hyperfine ground state $|0\rangle$ by optical pumping and in the superposition state $|0\rangle + |1\rangle$ by application of a proper combination of single-qubit operations (denoted by "H" in FIG. 7) to the hyperfine ground state $|0\rangle$.

In block 608, following the preparation of the quantum processor 106 in the initial state $|\Psi_0\rangle$, the trial state preparation circuit $A(\vec{\theta})$, $A(\vec{\gamma}, \vec{\beta})$ is applied to the quantum processor 106, by the system controller 104, to construct the trial state $|\Psi_\lambda(\vec{\theta})\rangle$, $|\Psi_\lambda(\vec{\gamma}, \vec{\beta})\rangle$ for evaluating an expectation of the sub-Hamiltonian. The reduced trial state preparation circuit $A_{PCC}^\lambda(\vec{\theta})$, $A_{PCC}^\lambda(\vec{\gamma}, \vec{\beta})$ is decomposed into series of two-qubit entanglement gate operations (entangling gates) and single-qubit operations (R gates) and optimized by the classical computer 102. The series of two-qubit entanglement gate operations (entangling gates) and single-qubit operations (R gates) can be implemented by application of a series of pulses, intensities, durations, and detuning of which are appropriately adjusted by the classical computer 102 on the set initial state $|\Psi_0\rangle$ and transform the quantum processor from the initial state $|\Psi_0\rangle$ to trial state $|\Psi_\lambda(\vec{\theta})\rangle$, $|\Psi_\lambda(\vec{\gamma}, \vec{\beta})\rangle$.

In block 610, following the construction of the trial state $|\Psi_\lambda(\vec{\theta})\rangle$, $|\Psi_\lambda(\vec{\gamma}, \vec{\beta})\rangle$ on the quantum processor 106, the expectation value $F_\lambda(\vec{\theta}) = \langle \Psi_\lambda(\vec{\theta}) | H_\lambda | \Psi_\lambda(\vec{\theta})\rangle$, $F_\lambda(\vec{\gamma}, \vec{\beta}) = \langle \Psi_\lambda(\vec{\gamma}, \vec{\beta}) | H_\lambda | \Psi_\lambda(\vec{\gamma}, \vec{\beta})\rangle$ of the sub-Hamiltonian $H_\lambda$ ($\lambda$=1, 2, ..., u) is measured by the system controller 104. Repeated measurements of states of the superconducting qubits in the quantum processor 106 in the trial state $|\Psi_\lambda(\vec{\theta})\rangle$, $|\Psi_\lambda(\vec{\gamma}, \vec{\beta})\rangle$ yield the expectation value the sub-Hamiltonian $H_\lambda$.

In block 612, following the measurement of the expectation value of the sub-Hamiltonian $H_\lambda$ ($\lambda$=1, 2, ..., u), blocks 606 to 610 for another sub-Hamiltonian $H_\lambda$ ($\lambda$=1, 2, ..., u) until the expectation values of all the sub-Hamiltonian $H_\lambda$ ($\lambda$=1, 2, ..., u) in the model Hamiltonian $H_C = \Sigma_{\lambda,1}^u H_\lambda$ have been measured by the system controller 104.

In block 614, following the measurement of the expectation values of all the sub-Hamiltonian $H_\lambda$ ($\lambda$=1, 2, ..., u), a sum of the measured expectation values of all the sub-Hamiltonian $H_\lambda$ ($\lambda$=1, 2, ..., u) of the model Hamiltonian $H_C = \Sigma_{\lambda=1}^u H_\lambda$ (that is, the measured expectation value of the model Hamiltonian $H_C$, $F(\vec{\theta}) = \Sigma_{\lambda,1}^u F_\lambda(\vec{\theta})$, $F(\vec{\gamma}, \vec{\beta}) = \Sigma_{\lambda=1}^u F_\lambda(\vec{\gamma}, \vec{\beta})$ is computed, by the classical computer 102.

In block 616, following the computation of the measured expectation value of the model Hamiltonian $H_C$, the measured expectation value $F(\vec{\gamma}, \vec{\beta})$ of the model Hamiltonian $H_C$ in the current iteration is compared to the measured expectation value of the model Hamiltonian $H_C$ in the previous iteration, by the classical computer 102. If a difference between the two values is less than a predetermined value (i.e., the expectation value sufficiently converges towards a fixed value), the method proceeds to block 620. If the difference between the two values is more than the predetermined value, the method proceeds to block 618.

In block 618, another set of variational parameters $\vec{\theta}$, $(\vec{\gamma}, \vec{\beta})$, for a next iteration of blocks 606 to 616 is computed by the classical computer 102, in search for an optimal set of variational parameters $\vec{\theta}$, $(\vec{\gamma}, \vec{\beta})$ to minimize the expectation value of the model Hamiltonian $H_C$, $F(\vec{\theta}) = \Sigma_{\lambda=1}^{u} F_\lambda(\vec{\theta})$, $F(\vec{\gamma}, \vec{\beta}) = \Sigma_{\lambda=1}^{u} F_\lambda(\vec{\gamma}, \vec{\beta})$. That is, the classical computer 102 will execute a classical optimization method to find the optimal set of variational parameters $\vec{\theta}$, $$(\vec{\gamma}, \vec{\beta}) \left( \min_{\vec{\theta}} F(\vec{\theta}), \min_{\vec{\gamma}, \vec{\beta}} F(\vec{\gamma}, \vec{\beta}) \right).$$

Example of conventional classical optimization methods include simultaneous perturbation stochastic approximation (SPSA), particle swarm optimization (PSO), Bayesian optimization (BO), and Nelder-Mead (NM).

In block 620, the classical computer 102 will typically output the results of the variational search to a user interface of the classical computer 102 and/or save the results of the variational search in the memory of the classical computer 102. The results of the variational search will include the measured expectation value of the model Hamiltonian $H_C$ in the final iteration corresponding to the minimized energy of the system in the selected quantum chemistry problem, or the minimized value of the objective function $C(z) = \Sigma_{\alpha=1}^{t} h_\alpha C_\alpha (z)$ of the selected combinatorial optimization problem (e.g., a shortest distance for all of the trips visiting all given cities in a travelling salesman problem) and the measurement of the trail state $|\Psi_\lambda(\vec{\theta})\rangle$, $|\Psi_\lambda(\vec{\gamma}, \vec{\beta})\rangle$ in the final iteration corresponding to the configuration of electrons or spins that provides the lowest energy of the system, or the solution to the N-bit string ($z = z_1 z_2 \ldots z_N$) that provides the minimized value of the objective function $C(z) = \Sigma_{\alpha=1}^{t} h_\alpha C_\alpha (z)$ of the selected combinatorial optimization problem (e.g., a route of the trips to visit all of the given cities that provides the shortest distance for a travelling salesman).

The variational search reduced trial state preparation circuits described herein provides an improved method for obtaining a solution to an optimization problem by the Variational Quantum Eigensolver (VQE) algorithm or the Quantum Approximate Optimization Algorithm (QAOA) on a hybrid quantum-classical computing system. Thus, the feasibility that a hybrid quantum-classical computing system may allow solving problems, which are not practically feasible on classical computers, or suggest a considerable speed up with respect to the best known classical algorithm even with a noisy intermediate-scale quantum device (NISQ) device.

While the foregoing is directed to specific embodiments, other and further embodiments may be devised without departing from the basic scope thereof, and the scope thereof is determined by the claims that follow.

The invention claimed is:

1. A method of performing computation in a hybrid quantum-classical computing system comprising a classical computer and a quantum processor, comprising:
   computing, by the classical computer, a model Hamiltonian onto which a selected problem is mapped, wherein the model Hamiltonian comprises a plurality of sub-Hamiltonians;
   executing iterations, each iteration comprising:
      setting the quantum processor in an initial state, wherein the quantum processor comprises a plurality of Josephson junctions, each of which has two frequency-separated states defining a superconducting qubit;
      transforming the quantum processor from the initial state to a trial state based on each of the plurality of sub-Hamiltonians and an initial set of variational parameters by applying a first trial state preparation circuit to the quantum processor;
      measuring an expectation value of each of the plurality of sub-Hamiltonians on the quantum processor; and
      selecting, by the classical computer, another set of variational parameters based on a classical optimization method, if a difference between the measured expectation values of the model Hamiltonian in a current iteration and a previous iteration is more than a predetermined value; and
   outputting the measured expectation value of the model Hamiltonian as an optimized solution to the selected problem.

2. The method according to claim 1, wherein the first trial state preparation circuit does not include gate operations that do not influence the expectation value of the each of the plurality of sub-Hamiltonians.

3. The method according to claim 1, wherein the selected problem is finding a lowest energy of a many-particle quantum system.

4. The method according to claim 3, further comprising:
   selecting, by the classical computer, the initial set of variational parameters,
   wherein the initial set of variational parameters is selected randomly.

5. The method according to claim 3, wherein setting the quantum processor in the initial state comprising setting the plurality of superconducting qubits in the quantum processor in an approximate state of the many-particle quantum system that is calculated by the classical computer.

6. The method according to claim 1, wherein the selected problem is a combinatorial optimization problem.

7. The method according to claim 6, further comprising:
   selecting, by the classical computer, the initial set of variational parameters,
   wherein the initial set of variational parameters is selected by the classical computer randomly.

8. The method according to claim 6, wherein setting the quantum processor in the initial state comprising setting, by a system controller, each superconducting qubit in the quantum processor in a superposition of the two frequency-separated states.

9. A method of performing computation in a hybrid quantum-classical computing system comprising a classical computer and a quantum processor, comprising:
   computing, by the classical computer, a model Hamiltonian onto which a selected problem is mapped, wherein the model Hamiltonian comprises a plurality of sub-Hamiltonians;

executing iterations, each iteration comprising:
    setting the quantum processor in an initial state, wherein the quantum processor comprises a plurality of Josephson junctions, each of which has two frequency-separated states defining a superconducting qubit;
    transforming the quantum processor from the initial state to a trial state based on each of the plurality of sub-Hamiltonians and an initial set of variational parameters by applying a first trial state preparation circuit to the quantum processor;
    measuring an expectation value of each of the plurality of sub-Hamiltonians on the quantum processor; and
    selecting, by the classical computer, another set of variational parameters based on a classical optimization method, if a difference between the measured expectation values of the model Hamiltonian in a current iteration and a previous iteration is more than a predetermined value; and
  outputting the measured expectation value of the model Hamiltonian as an optimized solution to the selected problem, wherein
  the selected problem is finding a lowest energy of a many-particle quantum system.

10. The method according to claim 9, wherein the first trial state preparation circuit does not include gate operations that do not influence the expectation value of the each of the plurality of sub-Hamiltonians.

11. The method according to claim 9, further comprising:
  selecting, by the classical computer, the initial set of variational parameters,
  wherein the initial set of variational parameters is selected randomly.

12. The method according to claim 9, wherein setting the quantum processor in the initial state comprising setting the plurality of superconducting qubits in the quantum processor in an approximate state of the many-particle quantum system that is calculated by the classical computer.

13. A method of performing computation in a hybrid quantum-classical computing system comprising a classical computer and a quantum processor, comprising:
  computing, by the classical computer, a model Hamiltonian onto which a selected problem is mapped, wherein the model Hamiltonian comprises a plurality of sub-Hamiltonians;
  executing iterations, each iteration comprising:
    setting the quantum processor in an initial state, wherein the quantum processor comprises a plurality of Josephson junctions, each of which has two frequency-separated states defining a superconducting qubit;
    transforming the quantum processor from the initial state to a trial state based on each of the plurality of sub-Hamiltonians and an initial set of variational parameters by applying a first trial state preparation circuit to the quantum processor;
    measuring an expectation value of each of the plurality of sub-Hamiltonians on the quantum processor; and
    selecting, by the classical computer, another set of variational parameters based on a classical optimization method, if a difference between the measured expectation values of the model Hamiltonian in a current iteration and a previous iteration is more than a predetermined value; and
  outputting the measured expectation value of the model Hamiltonian as an optimized solution to the selected problem, wherein
  the selected problem is a combinatorial optimization problem.

14. The method according to claim 13, wherein the first trial state preparation circuit does not include gate operations that do not influence the expectation value of the each of the plurality of sub-Hamiltonians.

15. The method according to claim 13, further comprising:
  selecting, by the classical computer, the initial set of variational parameters,
  wherein the initial set of variational parameters is selected by the classical computer randomly.

16. The method according to claim 13, wherein setting the quantum processor in the initial state comprising setting, by a system controller, each superconducting qubit in the quantum processor in a superposition of the two frequency-separated states.

* * * * *